US010651202B2

(12) United States Patent
Andrieu et al.

(10) Patent No.: US 10,651,202 B2
(45) Date of Patent: May 12, 2020

(54) 3D CIRCUIT TRANSISTORS WITH FLIPPED GATE

(71) Applicant: COMMISSARIAT A L'ENERGIE ATOMIQUE ET AUX ENERGIES ALTERNATIVES, Paris (FR)

(72) Inventors: Francois Andrieu, Saint-Ismier (FR); Perrine Batude, Dijon (FR); Maud Vinet, Claix (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/196,390

(22) Filed: Nov. 20, 2018

(65) Prior Publication Data

US 2019/0157300 A1    May 23, 2019

(30) Foreign Application Priority Data

Nov. 22, 2017   (FR) ...................................... 17 61058

(51) Int. Cl.
*H01L 27/12* (2006.01)
*H01L 21/84* (2006.01)
(Continued)

(52) U.S. Cl.
CPC .... *H01L 27/1203* (2013.01); *H01L 21/76251* (2013.01); *H01L 21/8221* (2013.01);
(Continued)

(58) Field of Classification Search
CPC ........... H01L 27/1203; H01L 21/76251; H01L 21/84; H01L 23/5226; H01L 23/5286;
(Continued)

(56) References Cited

U.S. PATENT DOCUMENTS 8,921,970 B1 * 12/2014 Or-Bach ................. H01L 24/25
257/499
2007/0105320 A1    5/2007 Yang
(Continued)

FOREIGN PATENT DOCUMENTS

EP         2 577 730 B1     4/2014

OTHER PUBLICATIONS

U.S. Appl. No. 15/485,246, filed Apr. 12, 2017, 2017/0301692 A1, Perrine Batude et al.
(Continued)

*Primary Examiner* — Fernando L Toledo
*Assistant Examiner* — Neil R Prasad
(74) *Attorney, Agent, or Firm* — Oblon, McClelland, Maier & Neustadt, L.L.P.

(57) ABSTRACT

An integrated circuit is provided with several superimposed levels of transistors, the circuit including an upper level provided with transistors having a rear gate electrode laid out on a first semiconducting layer, and a second semiconducting layer, a first transistor among the transistors of the upper level being provided with a contact pad traversing the second semiconducting layer, the contact pad being connected to a connection zone disposed between the first semiconducting layer and the second semiconducting layer, the first transistor being polarised by and connected to at least one power supply line disposed on a side of a front face of the second semiconducting layer that is opposite to the rear face.

12 Claims, 6 Drawing Sheets

(51) Int. Cl.
| | |
|---|---|
| *H01L 21/762* | (2006.01) |
| *H01L 23/528* | (2006.01) |
| *H01L 23/522* | (2006.01) |
| *H01L 27/06* | (2006.01) |
| *H01L 21/822* | (2006.01) |
| *H01L 27/088* | (2006.01) |
| *H01L 21/8234* | (2006.01) |
| *H01L 23/532* | (2006.01) |
| *H01L 21/033* | (2006.01) |
| *H01L 21/768* | (2006.01) |
| *H01L 21/285* | (2006.01) |
| *H01L 21/8238* | (2006.01) |
| *H01L 27/092* | (2006.01) |

(52) U.S. Cl.
CPC ...... *H01L 21/823437* (2013.01); *H01L 21/84* (2013.01); *H01L 23/5226* (2013.01); *H01L 23/5286* (2013.01); *H01L 27/0688* (2013.01); *H01L 27/088* (2013.01); *H01L 27/1207* (2013.01); *H01L 27/1288* (2013.01); *H01L 21/0337* (2013.01); *H01L 21/28518* (2013.01); *H01L 21/76275* (2013.01); *H01L 21/76283* (2013.01); *H01L 21/76805* (2013.01); *H01L 21/76807* (2013.01); *H01L 21/823475* (2013.01); *H01L 21/823828* (2013.01); *H01L 21/823871* (2013.01); *H01L 23/53228* (2013.01); *H01L 23/53257* (2013.01); *H01L 27/092* (2013.01)

(58) Field of Classification Search
CPC ............ H01L 27/1207; H01L 21/0337; H01L 21/28518; H01L 21/76275; H01L 21/76283; H01L 21/76805; H01L 21/76807; H01L 23/53228; H01L 23/53257

See application file for complete search history.

(56) References Cited

U.S. PATENT DOCUMENTS

| | | |
|---|---|---|
| 2010/0259296 A1 | 10/2010 | Or-Bach |
| 2012/0295423 A1 | 11/2012 | Guo et al. |
| 2013/0203248 A1 | 8/2013 | Ernst et al. |
| 2015/0102419 A1* | 4/2015 | Ikeda .............. H01L 21/823807 257/369 |
| 2016/0353038 A1 | 12/2016 | Madurawe et al. |

OTHER PUBLICATIONS

U.S. Appl. No. 15/602,829, filed May 23, 2017, 2017/0345931 A1, Shay Reboh et al.
U.S. Appl. No. 15/967,778, filed May 1, 2018, 2018/0331108 A1, Louis Hutin et al.
U.S. Appl. No. 15/949,566, filed Apr. 10, 2018, 2018/0301479 A1, Ivan-Christophe Robin et al.
U.S. Appl. No. 16/184,346, filed Nov. 8, 2018, Jean-Pierre Colinge.
U.S. Appl. No. 16/159,923, filed Oct. 15, 2018, Louis Hutin et al.
U.S. Appl. No. 15/184,076, filed Dec. 26, 2017, U.S. Pat. No. 9,852,950 B2, Claire Fenouillet-Beranger et al.
French Preliminary Search Report dated Sep. 19, 2018 in French Application 17 61058 filed on Nov. 22, 2017 (with English Translation of Categories of Cited Documents).
Shi, J. et al. "A 14nm Finfet Transistor-Level 3D Partitioning Design to Enable High-Performance and Low-Cost Monolithic 3D IC," IEDM16-39, 978-1-5090-3902-9, 2016, pp. 4.

* cited by examiner

3D CIRCUIT TRANSISTORS WITH FLIPPED GATE

TECHNICAL FIELD AND PRIOR ART

The present application relates to the field of integrated circuits provided with components distributed over several levels, in particular superimposed transistors. Such devices are generally qualified as 3-dimensional or "3D" integrated circuits.

It targets in particular the implementation of a 3D circuit provided with one or more upper stage(s) with transistor(s) having an improved arrangement.

Generally speaking, in the field of integrated circuits, it is continuously sought to increase the density of transistors.

To do so, one solution consists in distributing the transistors over several levels of semiconducting layers arranged one on top of the other. Such circuits thus generally comprise at least two semiconducting layers superimposed and separated from each other by an insulating layer.

The production of upper level transistors may involve the implementation of one or more heat treatment steps, notably when an activation of dopants is carried out.

However, a high temperature heat treatment may induce a degradation of the lower level(s) and in particular a deterioration of the material of the contacts in the lower level or of inter-level connection elements or even an untimely diffusion of dopants within the lower level.

Once the first level of transistors has been produced, it is thus generally sought to limit the thermal budget for manufacturing the upper level(s) and to avoid in particular implementing heat treatments above 550° C.

Yet, the manufacture of a gate dielectric of good quality and in particular suitable for making it possible to obtain transistors of which the threshold voltage varies little over time, may require in certain cases subjecting this dielectric to an annealing at a temperature exceeding the aforementioned thermal budget.

Furthermore, the distribution of transistors over several levels poses a problem of size of the interconnections. For example, to connect the gate of an upper level transistor to a lower level transistor, a conventional solution consists in raising a vertical connection element from the lower level to the upper level, this connection element being itself connected to a metal line itself connected to another vertical connection element to make contact with the upper level transistor.

The problem is thus posed of producing an integrated 3D circuit that is improved vis-à-vis at least one of the aforementioned drawbacks.

DESCRIPTION OF THE INVENTION

One embodiment of the present invention provides for a method for producing an integrated circuit provided with several superimposed levels of transistors, the method including the steps consisting in:

a) providing a structure comprising at least one first transistor of a lower level, the first transistor having a channel region formed in a first semiconducting layer, and forming on this structure: at least one gate pattern of at least one second transistor of an upper level of transistor(s) then, b) assembling this structure with a support provided with at least one second semiconducting layer resting on a substrate, a channel region of the second transistor being provided in a given zone of the second semiconducting layer.

Such a gate arrangement of the second transistor makes it possible to facilitate the connection between this gate and the lower level(s) and contributes to the reduction in size of the inter-level connections.

The fact of providing such an arrangement also makes it possible to produce the active zone(s) of transistors of the second level after having formed the gate(s) of the transistors of the second level, which notably makes it possible to integrate a gate dielectric of thermal oxide type for the upper level transistor(s), while respecting the constraints of limited thermal budget.

Thus, according to one advantageous embodiment, the second semiconducting layer may be already covered with a thermal oxide layer when the assembly of the support and the structure is carried out.

This thermal oxide layer is produced prior to the assembly and may be advantageously formed by means of at least one annealing step at a temperature above 600° C. A gate dielectric layer made of thermal oxide is thereby produced without having to subject the structure comprising the lower level(s) to a high thermal budget. An upper level transistor of improved quality is thereby obtained without subjecting the lower level(s) to high temperatures.

Advantageously, the gate pattern may be itself coated with a dielectric, such as a silicon oxide, or a dielectric stack, the dielectric or the dielectric stack being formed prior to step a) by deposition at a temperature below 550° C. and preferably below 500° C.

According to one advantageous embodiment, after assembly of the structure with the support it is possible to carry out a localised thinning of said given zone of the second semiconducting layer, so as to form a given zone thinned with respect to the regions of greater thickness on either side of said given zone of the second semiconducting layer. By means of such a thinning it is thereby possible to facilitate the control of the channel of the second transistor.

According to one particular embodiment, the localised thinning includes the oxidation of an upper portion of said given zone at a temperature below 500° C. With such a method the thermal budget is limited in order to preserve the lower level(s).

When the thinning includes the oxidation of an upper portion of said given zone through an opening of a mask formed on the second semiconducting layer, the method may advantageously further include the steps of:

removing the mask whereas an oxide masking resulting from the oxidation of the upper portion of said given zone is conserved, doping or silicidation of semiconducting regions on either side of said given zone, whereas said given zone is protected by the masking.

The masking resulting from the oxidation is thus exploited to serve to dope or silicidise regions of the second semiconducting layer while preserving the channel region of the second transistor.

Advantageously, the gate pattern may be that of a common gate electrode between the second transistor and a third transistor belonging to the upper level of transistors.

The method may further include, after assembly, cutting of the second semiconducting layer into portions that are unconnected and insulated from each other.

According to an advantageous embodiment, the cutting of the second semiconducting layer into portions that are unconnected and insulated from each other includes the formation of a trench traversing the second semiconducting layer and at least one gate pattern formed on said structure before assembly. A simultaneous and self-aligned cutting is thus carried out of active zones and gate electrodes separated from each other and situated facing these active zones.

According to an advantageous embodiment, the gate pattern of the second transistor may be connected in said structure to a conducting line through a via.

According to an advantageous embodiment, the conducting line is made of copper and the via traverses a dielectric copper diffusion barrier layer and formed on the conducting line.

According to a particular embodiment, after assembly, the method may include the formation of a contact pad traversing the second semiconducting layer or arranged against the second semiconducting layer, the contact pad being laid out in contact with a connection zone arranged between the first semiconducting layer and the second semiconducting layer.

Advantageously, the method may further include, after formation of the contact pad, the production of an alloy zone enveloping an upper portion and a lateral portion of the contact pad, the alloy zone being in contact with a portion of the second semiconducting layer.

According to another aspect, the present invention provides for an integrated circuit provided with several superimposed levels of transistors including:
 a lower level provided with at least one first transistor, the first transistor having a channel region formed in a first semiconducting layer resting on a substrate,
 an upper level provided with transistors having respective channel regions formed in zones that are distinct and insulated from each other by a second semiconducting layer arranged above the first semiconducting layer and each comprising a single gate electrode, this gate electrode being laid out on a rear face of the second semiconducting layer and extending between the first semiconducting layer and the second semiconducting layer.

The gate electrode may be common to an N type transistor and to a P type transistor each belonging to said upper level, said N type transistor having a channel region formed in a zone of the second semiconducting layer that is unconnected and insulated from another zone of the second semiconducting layer into which extends a channel region of said P type transistor.

Advantageously, the gate electrode is connected to a connection zone or to a conducting line arranged between the first semiconducting layer and the second semiconducting layer.

According to one particular embodiment of the circuit, at least one transistor among said transistors of said upper level is provided with a source or drain contact pad connected to a connection zone arranged between the first semiconducting layer and the second semiconducting layer, the contact pad traversing the second semiconducting layer or being arranged against the second semiconducting layer.

According to one particularly advantageous embodiment of the integrated circuit in which the upper level is provided with transistors forming a memory cell or a logic cell: the cell includes at least one input and at least one output connected to one or more connection zones arranged on the side of a rear face of the second semiconducting layer between the first semiconducting layer and the second semiconducting layer, the transistors of the logic cell being polarised by means of at least one power supply line arranged on the side of a front face of the second semiconducting layer opposite to said rear face.

Such an arrangement in which are arranged the inputs/outputs to a stage of the circuit and the power supply lines to another stage of the circuit notably makes it possible to facilitate the connections to the logic cell.

BRIEF DESCRIPTION OF THE DRAWINGS

The present invention will be better understood on reading the description of exemplary embodiments, given for purely illustrative purposes and in no way limiting, and by referring to the appended drawings in which.

Identical, similar or equivalent parts of the different figures bear the same numerical references in order to make it easier to go from one figure to the next.

The different parts represented in the figures are not necessarily according to a uniform scale, in order to make the figures more legible.

Moreover, in the following description, terms that depend on the orientation of the structure such as "on", "below", "above", "vertical", "lower", "upper" apply while considering that the structure is oriented in the manner illustrated in the figures.

DETAILED DESCRIPTION OF PARTICULAR EMBODIMENTS

Figure 1A:
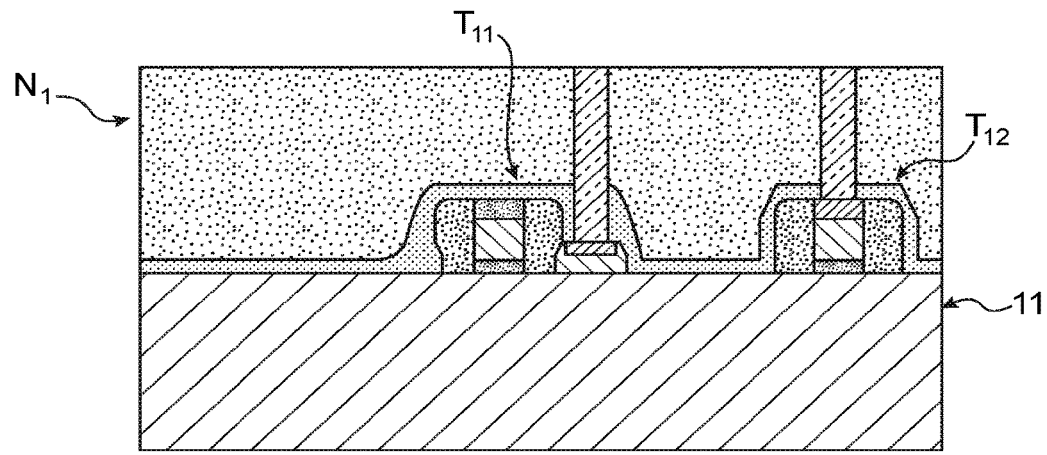
FIGS. 1A-1B serve to illustrate an example of 3D integrated circuit such as implemented according to the invention and provided with an upper level transistor provided with a single gate electrode laid out between the semiconducting layer of this upper level transistor and a semiconducting layer of a lower level.
Figure 1B:
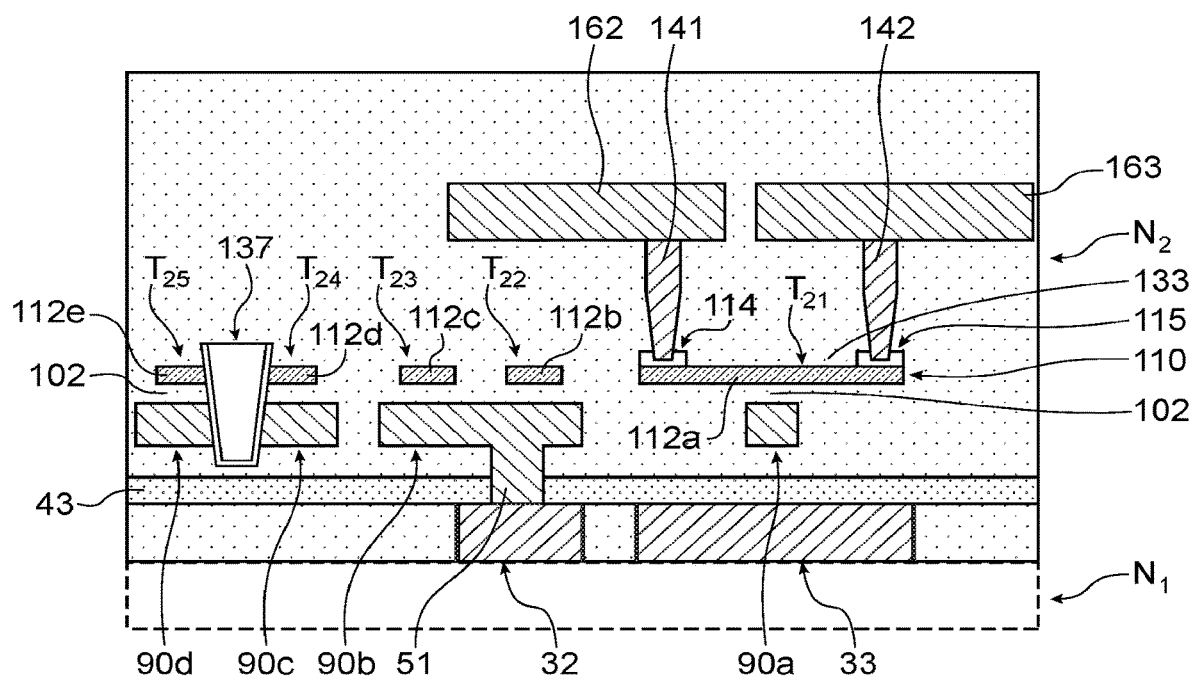

Reference is now made to FIGS. 1A and 1B in which different levels $N_1$, $N_2$ of an example of 3D integrated circuit with transistors distributed over several levels are represented.

The device is formed from a substrate including a first superficial semiconducting layer 11 in which one or more channel regions of one or more transistors of a first level $N_1$ of transistors are provided. In the example illustrated in FIG. 1A, the transistors $T_{11}$, $T_{12}$, of the first level $N_1$ may be implemented on a bulk substrate or instead on a semiconductor on insulator type substrate, in particular a SOI (Silicon On Insulator) type substrate, advantageously according to a fully depleted semiconductor on insulator, also called FDSOI (Fully Depleted Silicon On Insulator), technology.

The circuit is provided with at least one second level $N_2$ of transistors arranged on the first level $N_1$ (the first level $N_1$ being represented schematically by a discontinuous framework in FIG. 1B) and in which respective channel regions 112a, 112b, 122c, 112d, 112e extend into a second semiconducting layer 110.

The second level $N_2$ of transistors comprises transistors $T_{21}$, $T_{22}$, $T_{23}$ in which the respective gates 90a, 90b, 90c, 90d have a particular arrangement, these being situated under the second semiconducting layer 110, in other words between the second semiconducting layer 110 and the first semiconducting layer 11. The transistors $T_{21}$, $T_{22}$, $T_{23}$ in this example are each provided with a single gate electrode which is thereby located below their respective channel regions 112a, 112b, 122c, 112d, 112e.

The channel regions 112a, 112b, 122c, 112d, 112e are typically covered with a layer of dielectric material 133 of composition and sufficient thickness to make it possible to prevent electrostatic coupling from above. The channel regions 112a, 112b, 122c, 112d, 112e are thus only controlled in this example from below, respectively through gates 90a, 90b, 90c, 90d.

The transistors of the first level $N_1$ and those of the second level $N_2$ are thereby located positioned in opposite senses to each other, in other words "head to tail". Such an arrangement of the gate electrodes of the second level $N_2$ enables easier access to a first stage of typically metal connecting conducting lines 32, 33 laid out between the first level $N_1$ of transistor(s) and the second level of transistor(s) and to limit the density of interconnecting metal lines in the second level $N_2$. The fact of providing a particular arrangement of the gates 90a, 90b, 90c, 90d also leads, in an advantageous manner, to a different implementation of the 3D circuit and in which the gates and gate dielectrics of the transistors may be produced before the active zones.

The fact of providing an "inverted" arrangement of the gates 90a, 90b, 90c, 90d, also makes it possible to integrate a gate dielectric 102 of thermal oxide type, for example $SiO_2$ for the transistors of the second level, in other words an oxide having undergone a heat treatment in order to improve its electrical properties. Transistors formed based on such a thermal oxide have a lower NBTI (acronym for Negative Bias Temperature Instability), which represents a better maintaining over time of their threshold voltage.

In the example illustrated, the channel regions 112a, 112b, 112c, 112d of the transistors of the second level $N_2$ are formed from a same discontinuous semiconducting layer 110, more particularly in semiconducting zones or portions that are unconnected and insulated from each other typically by a dielectric material.

Advantageously, certain transistors $T_{22}$, $T_{23}$ may be provided with channel regions 112c, 112b that are unconnected but provided with a common gate electrode 90b.

In the example illustrated, the gate electrode 90b is connected to the first stage of interconnecting lines, and in particular to a conducting connection line 32, for example through a simple vertical connection element 51 commonly called "via".

One way of fabricating such a gate electrode 90b connected to a first stage of interconnecting lines is to use a "Back-end-of line" (BEOL) type method in particular with a dual Damascene technique. The interconnecting conducting lines may be in this case provided made of copper.

In this case, the copper is formed in trenches coated with a copper diffusion barrier 41. Such a barrier 41 is typically formed of a Ti/TiN or Ta/TaN stack. It is thereby possible to produce a copper diffusion barrier encapsulation below and laterally by means of this stack. An encapsulation on the top may also be provided either through a barrier to the diffusion of an element situated above, for example a diffusion barrier of an upper via, or by means of a dielectric barrier layer 43, in particular made of SiN.

In the example illustrated in FIG. 1B, the conducting lines 32, 33 are encapsulated laterally by a conducting diffusion barrier 41 for example formed of a Ti/TiN or Ta/TaN stack and on top by a dielectric barrier layer 43, for example made of silicon nitride.

Preferably, the gates 90a, 90b, 90c, 90d are provided based on a conductor material that diffuses less than copper, such as for example tungsten.

One or more connection elements situated under the gates may also be made of a conductor material different from copper. This avoids having to form an upper nitride dielectric encapsulation for these gates.

In the example illustrated, a vertical connection element 51 or via is formed for example of W and connected to a connection conducting line 32 made of Cu and encapsulated.

Among the transistors of the upper level, other transistors $T_{24}$, $T_{25}$ may be provided with unconnected channel regions 112e, 112d and independent gate electrodes 90c, 90d. In the example illustrated in FIG. 1B, a vertical insulating structure 137 separates both the gate electrodes 90c, 90d of the transistors $T_{24}$, $T_{25}$ but also their respective channel regions 112d, 112e formed from the same semiconducting layer 110. The transistors $T_{24}$, $T_{25}$ formed in regions that are distinct and separated from each other by the vertical insulating structure may be respectively an N type transistor and a P type transistor.

According to one particular arrangement of the second level $N_2$, it is possible to provide a transistor $T_{22}$ with an inverted gate and situated on the side of a so-called "rear face" of the second semiconducting layer 110, while being provided with source 114 and drain 115 regions which protrude on a front face of the second semiconducting layer 110 opposite to the rear face. Such an arrangement of the source and drain regions 114, 115 enables access by the top of the source 114 and drain 115 regions, whereas access to the gate may be made by the bottom. Thus, contact pads 141, 142 traversing the layer of dielectric material 133 covering the transistor $T_{21}$ may be provided to make it possible to connect the source 114 and drain 115 regions of the transistor $T_{21}$, for example to interconnecting metal lines 162, 163 of an upper stage of interconnecting lines.

Figure 2:
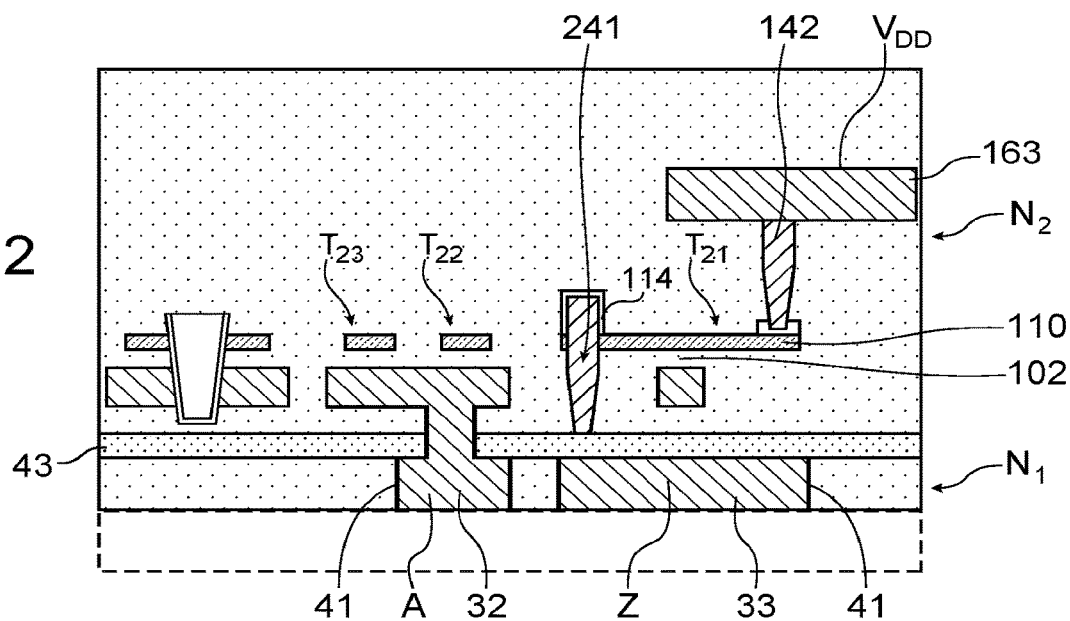
FIG. 2 serves to illustrate one particular embodiment of the 3D circuit in which the inputs/outputs and the power supply lines are provided in different stages.

An alternative arrangement is illustrated in FIG. 2, with a transistor $T_{22}$ of which a semiconducting region, here the source region 114, is traversed or bordered by a contact pad 241 connected with the lower stage through for example the connecting line 33. This arrangement of the through contact pad 241 enables a gain in compactness of the interconnections and contributes to the reduction of the density of the connection lines of the second level $N_2$. Such a type of contact pad 241 may also be provided for a drain region, but in the example illustrated in FIG. 2, the drain region 115 is connected to a contact pad 142 which extends in an opposite direction, here to the upper stage of interconnecting lines and in particular to a line 162 belonging to the second level $N_2$.

The contact pad 241 is here not connected to an upper stage of interconnecting lines belonging to the second level $N_2$ or above the second level $N_2$. The contact pad 241 is thus not connected to a conducting line or zone situated above the second semiconducting layer 110. A connection of the source and drain of the transistor $T_{22}$ to different levels is thus advantageously made, which makes it possible to avoid having a too high density of metals on a same level. With such an arrangement, it is possible to dissociate the interconnection level provided for the inputs/output from that provided for the biasing or power supply.

A particular embodiment of the 3D circuit provides for integrating transistors belonging to a cell suitable for carrying out a logic function. In the example illustrated in FIG. 2, the logic cell comprises one or more inputs A and one or more outputs Z provided in the lower stage of interconnecting lines of the first level $N_1$. The transistors of this cell are polarised through lines VDD, GND this time provided in the upper stage of interconnecting lines belonging to the second level $N_2$ and able, respectively, to apply a supply voltage Vdd and serve as ground or reference potential Gnd. In this way are dissociated into distinct levels the lines serving as access to the inputs/output of the logic cell with respect to the power supply lines. This also contributes to the reduction of the density of interconnections of the circuit. In the particular example of FIG. 2, an input A and an output Z are connected to conducting lines 32, 33 situated below the gates 90c, 90a of transistors of the second level $N_2$ whereas a line 163 serving for the biasing of the transistors is situated above the second semiconducting layer 110 from which are produced the transistors of the second level $N_2$.

Such an arrangement, in which the input A/output Z of the biasing lines are dissociated into different stages may be applied to the implementation of a logic cell ensuring the function of inverter.

Figure 3:
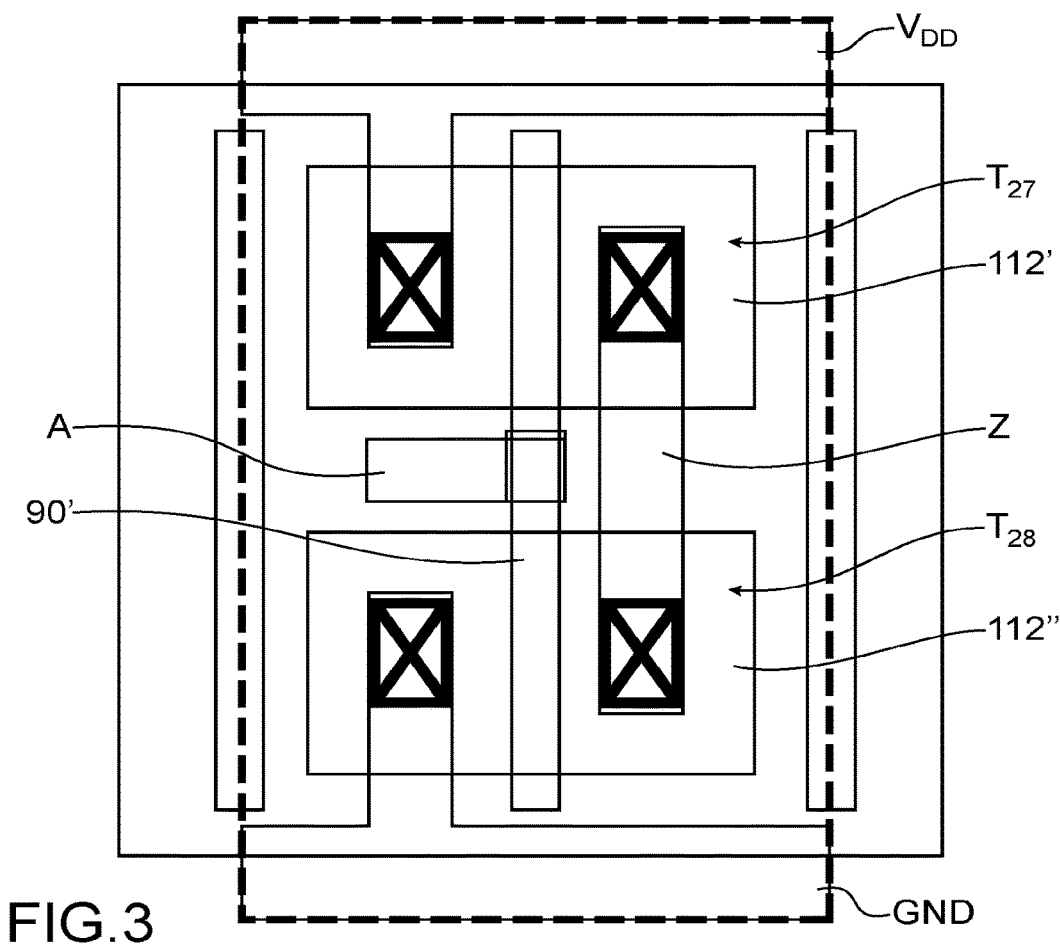
FIG. 3 serves to illustrate a logic inverter reproducing an arrangement of the type of that of FIG. 2.

A logic inverter cell is illustrated for example in FIG. 3.

The cell is here formed of transistors $T_{27}$, $T_{28}$ respectively PMOS and NMOS formed in the second level $N_2$ of the circuit and sharing a single common rear gate 90' of which the arrangement is such as described previously. The active zones of the transistors are the regions 112', 112" that are distinct and insulated from each other of the second semiconducting layer 110. The power supply VDD and ground GND lines are provided in an upper metal level situated above the metal level in which the input A/output Z of the cell are laid out.

Such an arrangement, where biasing and input/output lines are dissociated into different stages may also be applied to the implementation of a memory cell.

An example of method for the production of a 3-dimensional or "3D" integrated circuit, of the type described previously, with an upper stage of transistors with flipped gate, will now be given in relation with FIGS. 4A-4F.

Figure 4A:
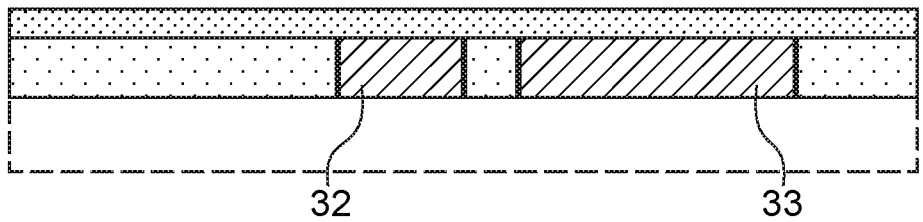
FIGS. 4A-4F serve to illustrate an example of method for producing a circuit with superimposed transistors with an upper level provided with at least one transistor with flipped gate electrode and making it possible to integrate a thermal oxide for the gate dielectric of the upper level while preserving the lower level(s)
Figure 4B:
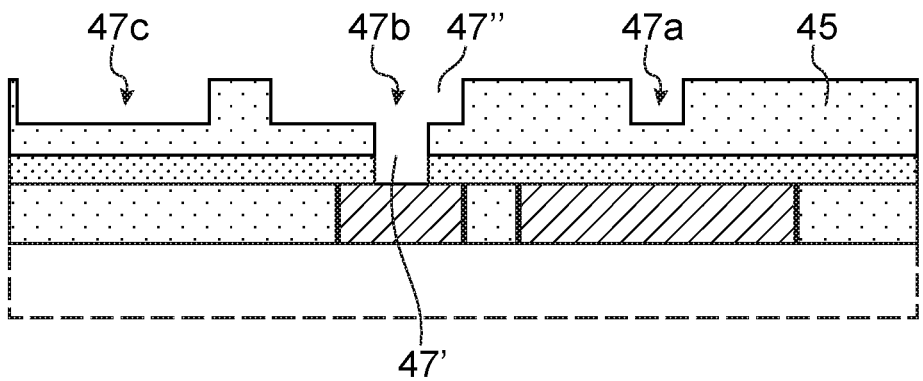
Figure 4C:
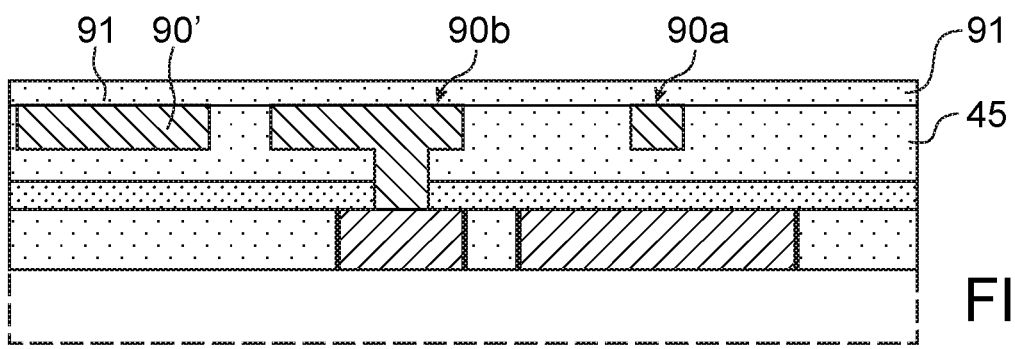

FIG. 4A illustrates a possible starting structure of the method provided with a first level $N_1$ of transistors (represented schematically by a framework in dashed lines) comprising channel regions which extend into a semiconducting layer of a substrate that may be bulk, or of semiconductor on insulator type, in particular of SOI or FDSOI type.

One or more conducting connection lines 32, 33 belonging to the level $N_1$ are also formed above the transistors produced from the first semiconducting layer.

The conducting lines 32, 33 may be made of copper and encapsulated at least laterally by a conducting copper diffusion barrier layer 41 formed for example of a Ti/TiN or Ta/TaN stack. The conducting lines 32, 33 are covered with a dielectric layer 43, for example made of silicon nitride, and which may also be configured so as to form a copper diffusion barrier.

A dielectric material (or stack of materials) 45 is next deposited (FIG. 4B), in which one or more holes 47a, 47b, 47c are formed. In the example illustrated, the holes 47a, 47c are in the form of trenches whereas a hole 47b comprises an upper part in the form of trench and a lower part 47' of reduced section. The lower part 47' traverses the dielectric layer 43 and reveals a conducting line 32 belonging to the level $N_1$.

The dielectric material 45 is advantageously provided with a permittivity below 3.5 and for example of the order of 2.3 or 2.7. For example, the dielectric material is a silicon oxide. Providing a dielectric material of low permittivity makes it possible to achieve good lateral insulation of the gate that is to be formed thereafter in the layer of dielectric material 45.

A conducting layer 90 which may be made of metal such as for example tungsten is next deposited in the holes 47a, 47b, 47c. Then, the part of the conducting layer 90 above the mouth of the holes 47a, 47b, 47c is removed by chemical mechanical polishing (CMP). The upper part of the trench 47b filled with the conducting layer 90 forms a gate pattern 90b, whereas the lower part of this trench 47b filled with the conducting layer 90 forms a connection via 51 with a conducting line 32. Typically, gate patterns 90a, 90b, 90' are thereby produced by photolithography and arranged as a function of the arrangement of conducting zones 32, 33, 51 of the interconnection stage already produced. In this exemplary embodiment, particular patterns of gates 90a, 90b, 90' and a via made of tungsten on a conducting line made of copper are formed.

An insulating layer 91, based on a dielectric material or stack of dielectric materials is next deposited so as to cover the patterns 90a, 90b, 90' notably in order to facilitate the assembly of the first level $N_1$ with another support. The insulating layer 91 is for example made of silicon oxide and preferably deposited at a temperature below 500° C. in order not to degrade the first level $N_1$. The insulating layer 91 may be optionally formed of a dielectric material different from the material 45 in which the gate is formed.

Figure 4D:
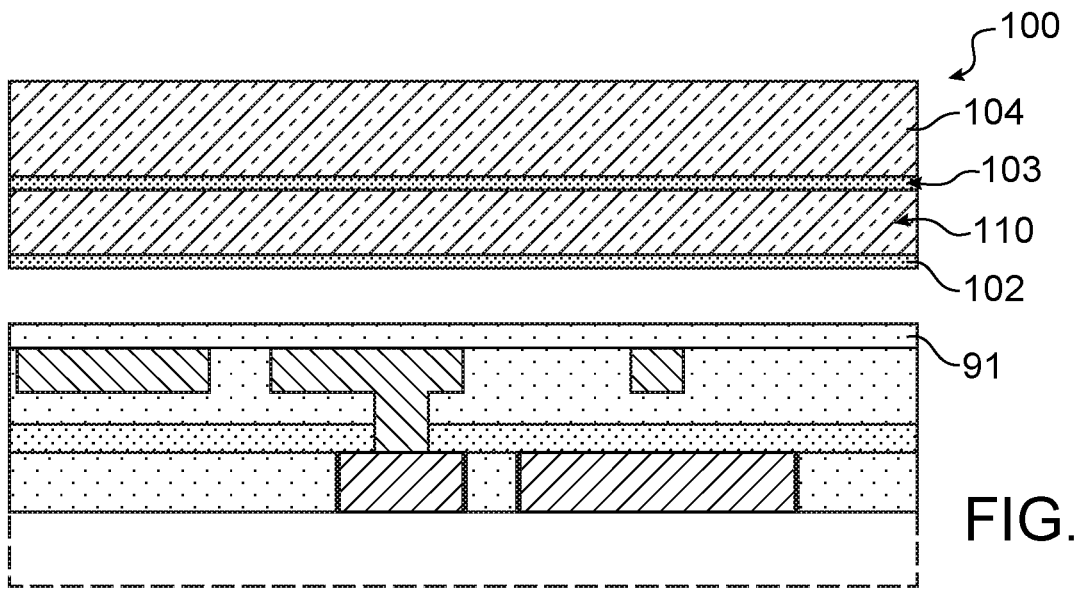

Such an assembly is illustrated for example in FIG. 4D.

The support 100 that is transferred onto the stage already produced is provided with a semiconducting layer 110 from which one or more transistors of an upper level are able to be formed. According to one particular embodiment, in order to produce junctionless transistors in the upper level, the semiconducting layer 110 may be already doped at a concentration for example provided between $1*10^{16}$ atoms/cm³ and $1*10^{19}$ at./cm³.

The support 100 is typically coated with a layer of dielectric material 102 laid out on the semiconducting layer 110.

The layer of dielectric material 102 is intended to form a gate dielectric for the upper level transistors and may advantageously be provided based on oxide, typically a thermal oxide, for example based on $SiO_2$. The heat treatment of the oxide is, advantageously, carried out before assembly.

This makes it possible to form an oxide of good quality. Thus, the oxide 102 of the support 100 may be subjected to an annealing step at a temperature that may be above 600° C. in order to improve its reliability, without however degrading the structure on which the first level of transistors has already been produced.

The assembly may be implemented by molecular bonding, for example of oxide-oxide type between the insulating layer 91 and the oxide layer 102. Typically, the semiconducting layer 110 of the support 100 is arranged on one or more layers 103, 104, with in particular an etching stop layer 103 for example made of silicon oxide and a thick mechanical support layer for example made of silicon.

Figure 4E:
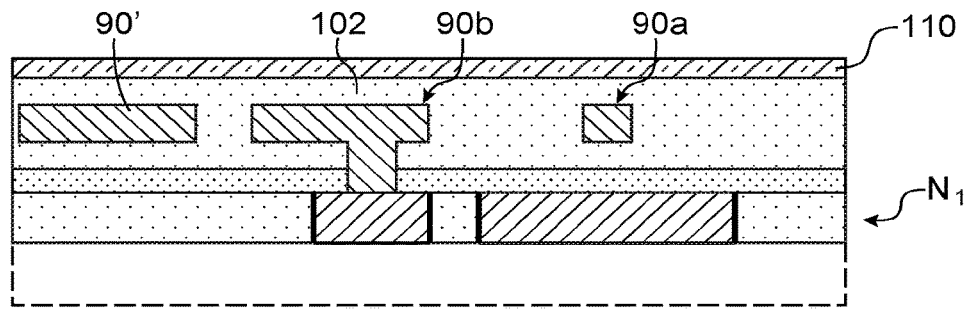

These layers 103, 104 are sacrificial and are removed once the assembly has been produced (FIG. 4E).

Figure 4F:
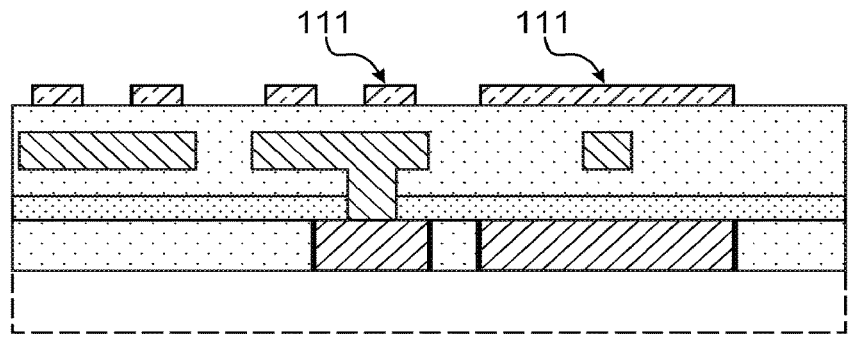

FIG. 4F illustrates a later step of cutting the semiconducting layer 110 into several distinct portions 111 in which active zones of transistors insulated from each other are provided. Such a step is typically carried out by photolithography, then etching.

To complete the production of the second level $N_2$, it is next possible to form source and drain regions, then to cover the active zones with one or more insulating layers and next produce contacts as well as at least one upper interconnection stage.

According to one alternative embodiment of the method that has just been described, in a case where it is wished to form the gate electrodes 90a, 90b of the upper level transistors based on copper, it is possible to provide one or more diffusion barrier layers around these gate electrodes 90a, 90b. The gate dielectric layer may itself include a thickness, for example made of silicon nitride (SiN), formed on the electrodes and serving as diffusion barrier.

In this case, the gate dielectric may be formed of a stack of layers of which a diffusion barrier layer typically made of silicon nitride (SiN) and a thermal oxide layer, for example made of $SiO_2$.

Figure 5:
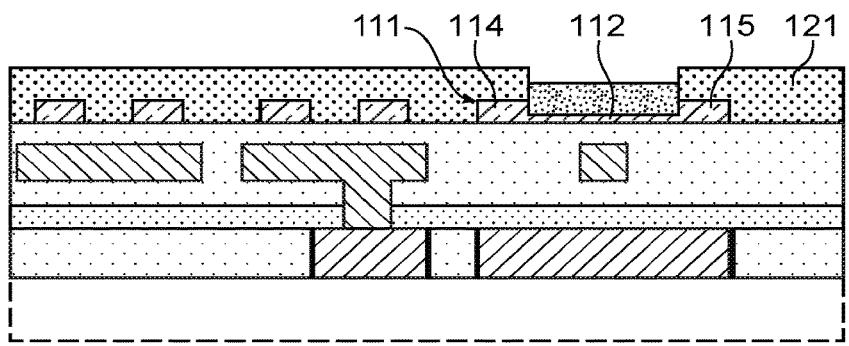
FIG. 5 serves to illustrate an alternative of method in which a thinning of the channel region of a transistor is carried out.

FIG. 5 illustrates one particular embodiment and notably one way of forming semiconducting source and drain regions of greater thickness than the channel region 112 for a transistor of the second level $N_2$.

To manufacture this thinned channel region 112, it is possible to form a hard mask 121, for example by producing a SiN and $SiO_2$ stack in which at least one opening 122 typically structured by photolithography is provided. Through this opening 122 of the hard mask 121, an oxidation is next carried out of an upper thickness of a portion 111 of the semiconducting layer 110, the hard mask 121 serving as oxidation mask in order to protect the non-exposed parts of the semiconducting layer 110. Advantageously, this oxidation is carried out at low temperature, preferably below 500° C., in order not to degrade the lower level(s) of transistors. The oxidised thickness 123 may next be removed or conserved as for example in FIG. 6.

Figure 6:
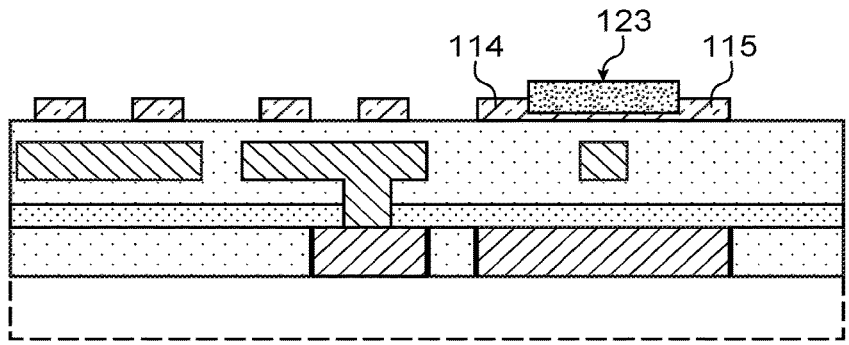
FIG. 6 serves to illustrate an example of method in which a thinned channel region is protected with a view to later steps of doping the source and drain regions and/or silicidation of these source and drain regions.

In the example of FIG. 6 a mask 123 of oxide, resulting from the oxidation of the semiconducting layer 110, is conserved in order to use it as protection during optional later steps of doping of the source and drain regions 114, 115 and of activation of dopants. Such doping and activation steps are optional in the case where the semiconducting layer 110 was already doped during its assembly. Such a mask 123 may also serve as protection during an optional later step of formation of semiconductor and metal alloy, in particular silicidation on the source and drain regions 114, 115. The production of the mask 123 may require a photolithography step. In the case where a junctionless transistor is produced, an additional doping step is not obligatory and self-alignment is not necessary.

As indicated previously, after formation of the gates, then active zones of the upper level transistors, it is possible to provide to produce contacts, in particular to establish a connection with the source or drain regions of the upper level transistors $N_2$.

Figure 7A:
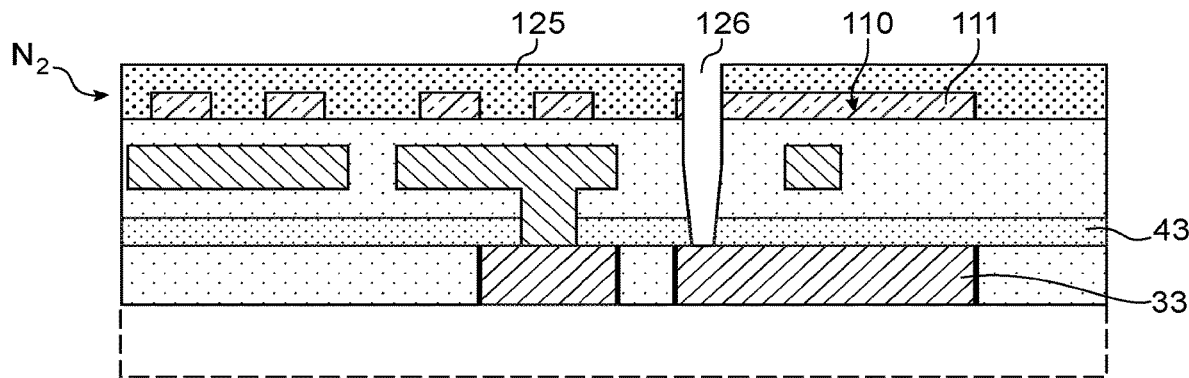
FIGS. 7A-7C serve to illustrate an alternative of method in which a contact pad is formed between a source or drain region of a transistor and a connection zone situated under this transistor.
Figure 7B:
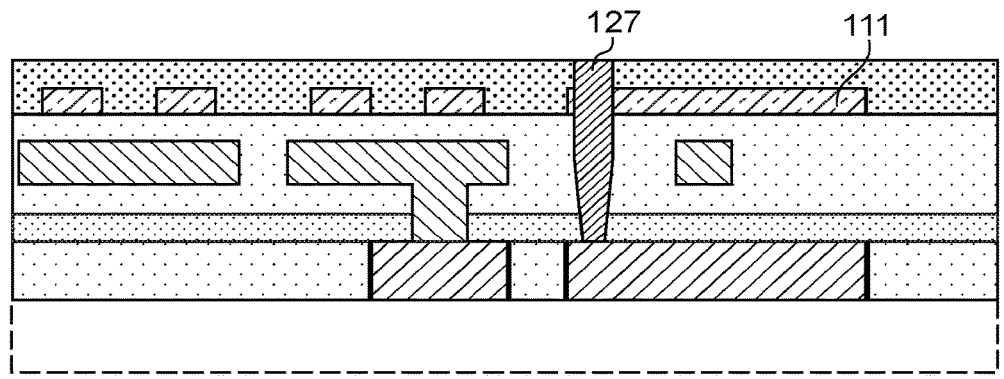
Figure 7C:
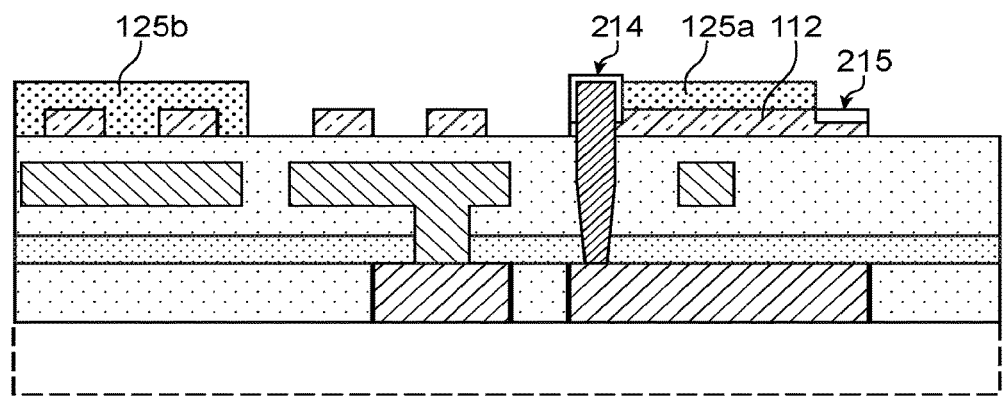

FIGS. 7A-7C illustrate an exemplary embodiment in which a particular contact pad is implemented. This contact pad is produced either through a portion 111 of the semiconducting layer 110 or instead borders the edge of a portion 111 of the semiconducting layer 110. In both cases, this pad is laid out in contact with this semiconducting layer 110 and makes it possible to produce a source or drain contact to a conducting line 33 situated under the semiconducting layer 110.

Such an alternative of method may include the formation of a masking 125 on the etched portions 111 of the semiconducting layer 110 (FIG. 7A).

This masking 125, for example provided with a layer made of silicon nitride, comprises at least one hole 126 revealing an etched semiconducting portion 110, that can be next prolonged into the underlying insulating layers 37, 39 until reaching a lower level conducting line 33 belonging to a lower stage of interconnecting lines.

The hole 126 is next filled with conductor material 127, typically a metal such as W (FIG. 7B). Prior to this filling, it is possible to provide to line the hole of a diffusion barrier layer if for example a filling by means of copper is envisaged. The filling of the hole 126 with the conductor material 127 may then be followed by a step of CMP (Chemical Mechanical Polishing) in order to remove a potential portion of conductor material 127 extending beyond the mouth of the hole.

In FIG. 7C, a later step of formation of at least one region 113 of metal and semiconductor alloy on a portion 111 of the semiconducting layer 110 is illustrated. When this portion 111 is made of silica, a silicidation is thus carried out of a zone of this portion 111, for example to form a region 128 made of alloy of metal and semiconductor, typically a silicide based on NiSi. The region 128 made of metal alloy forms a drain or source contact.

On the pad 127, it is also possible to provide to produce a zone 129 made of metal alloy, for example WNi or $NiW_2$. The alloy zone 129 produced envelopes an upper portion and a lateral portion of the contact pad 127. The alloy zone is in contact with a region of the second semiconducting layer 110. The metal alloy zone 129 thus makes it possible not only to ensure a lateral contact with the semiconducting portion 111 but also to enable a placing in contact from above. The interest of such a zone 129 is to increase the contact surface and thus to reduce the source or drain resistance, depending on whether this region is intended to form a source or drain contact.

A part 125a of the masking 125 having served for the formation of a contact pad 127 may be kept in order to protect the channel region 112 of the transistor during the formation of the regions 128, 129. The masking 125 may have thus be removed partially so as to reveal semiconducting source and drain regions. In the exemplary embodiment illustrated in FIG. 5C, a part 125b of the masking 125 is kept on other semiconducting portions 111. Other non-covered semiconducting portions may be silicidised.

Figure 8A:
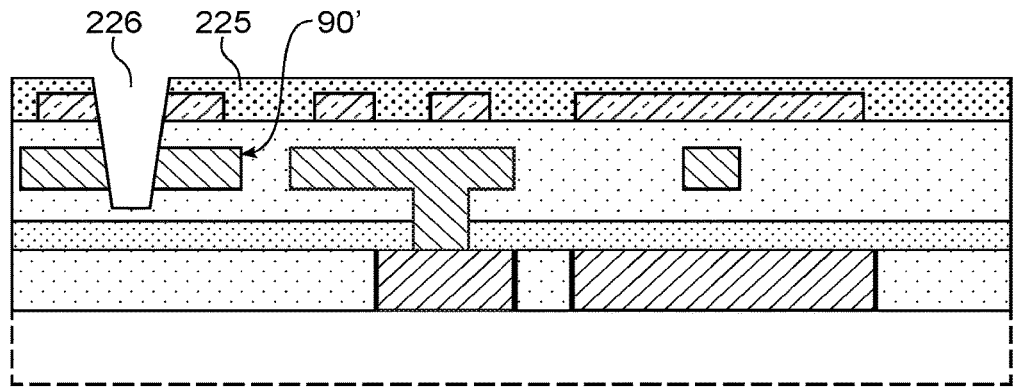
FIGS. 8A-8C serve to illustrate an alternative of method in which a cutting of active zones and gate electrodes is carried out, to obtain separated active zones and self-aligned separated gate electrodes.
Figure 8B:
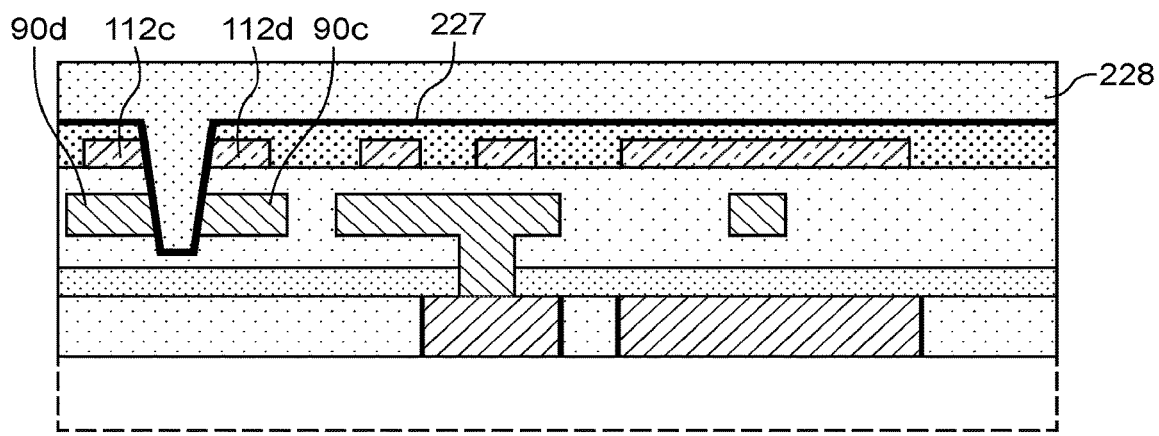
Figure 8C:
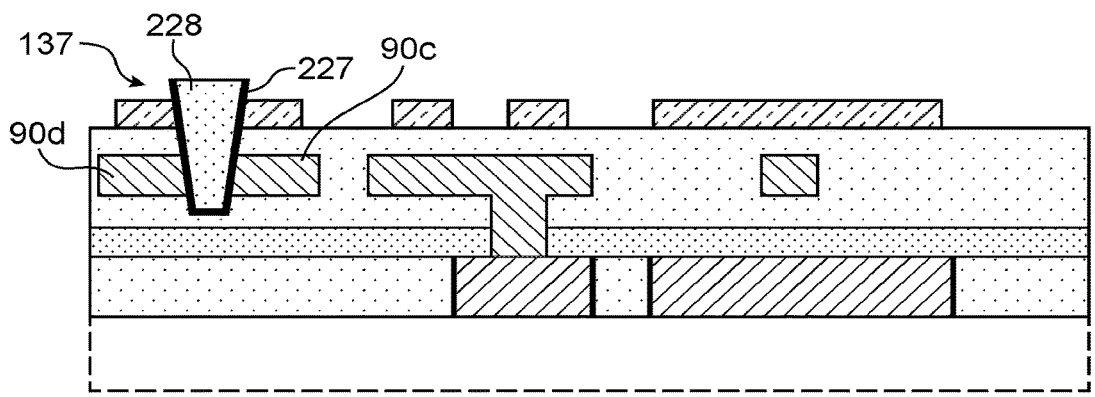

According to another alternative embodiment illustrated in FIGS. 8A-8C, it is possible to provide a 3D circuit with two upper level transistors situated side by side and of which the respective active zones and gates are insulated from each other by a vertical insulating structure 137.

This alternative may include the formation of a masking 225 on the etched portions 111 of the semiconducting layer 110 (FIG. 8A). The masking 225, for example made of silicon nitride, comprises at least one opening 226 that can next be prolonged through a semiconducting portion 111 of the second semiconducting layer 110 as well as through a pattern 90' made of gate material arranged under the second semiconducting layer 110. The semiconducting portion 110 is thus separated into two distinct semiconducting portions 112c, 112d and the gate pattern 90' into two distinct gate patterns 90d, 90c.

The opening 226 is next filled with insulator 228 (FIG. 8B). Prior to this filling, a thin diffusion barrier layer 227, preferably dielectric and for example made of silicon nitride, may advantageously be produced so as to line the sides and the bottom of the opening 226. This layer 227 is for example deposited by an ALD (Atomic Layer Deposition) or CVD (Chemical Vapour Deposition) type technique. The thin diffusion barrier layer 227 may serve notably in the case where distinct gate patterns 90d, 90c made of copper are formed.

The filling of the opening 226 by the insulating material 228 may then be followed by a CMP (Chemical Mechanical Polishing) step in order to remove the insulating material 228 extending beyond the mouth of the opening 226. The assembly formed of the barrier layer 127 and the insulating material 228 forms a vertical insulating structure 137 separating both one from the other the patterns of gates 90d, 90c and the semiconducting portions 112c, 112d one from the other. With such a method, channel regions 112c, 112d, self-aligned with their respective gate electrodes 90c, 90d, are thus formed.

The invention claimed is:

1. An integrated circuit provided with several superimposed levels of transistors, the integrated circuit comprising:
   a lower level including at least a transistor having a channel region formed in a first semiconducting layer resting on a substrate; and
   an upper level, disposed above the lower level and provided with transistors having respective channel regions formed in zones that are unconnected and insulated from each other, the zones comprising a second semiconducting layer disposed above the first semiconducting layer and covered with a dielectric material, each zone comprising a gate electrode disposed on a rear face of the second semiconducting layer and disposed between the first semiconducting layer and the second semiconducting layer, the rear face being parallel to a plane of an interface between the lower level and the upper level,
   wherein a first transistor among the transistors of the upper level is provided with a source or drain contact pad traversing the second semiconducting layer, the contact pad being connected to a connection zone disposed between the first semiconducting layer and the second semiconducting layer, the first transistor being biased by and connected to at least one power supply line disposed on a side of a front face of the second semiconducting layer, the front face being parallel to the rear face and disposed opposite to the rear face.

2. The integrated circuit according to claim 1, wherein at least one second transistor among the transistors of the upper level is a second N type transistor and comprises a common gate electrode shared with a third P type transistor belonging to the upper level,
the common gate electrode being disposed on the rear face of the second semiconducting layer and being disposed between the first semiconducting layer and the second semiconducting layer, and
the second N type transistor having a channel region formed in a zone among the zones of the second semiconducting layer that is unconnected and insulated from another zone among the zones of the second semiconducting layer into which extends a channel region of the third P type transistor.

3. The integrated circuit according to claim 2, wherein the common gate electrode between the second N type transistor and the third P type transistor is connected through a via to a connection zone disposed between the first semiconducting layer and the second semiconducting layer.

4. The integrated circuit according to claim 3, wherein the connection zone is a metal line made of copper, the common gate electrode and the via being made of another metal material different from copper, the via traversing a dielectric copper diffusion barrier layer.

5. The integrated circuit according to claim 1, wherein a first transistor among the transistors of the upper level is provided with a first channel region formed in a first portion of the second semiconducting layer and a second transistor of the upper level is provided with a second channel region formed in a second portion of the second semiconducting layer that is unconnected and insulated from the first portion through an insulating trench traversing the second semiconducting layer, the insulating trench separating a first gate of the first transistor and a second gate of the second transistor.

6. The integrated circuit according to claim 5, wherein the first transistor and the second transistor are respectively an N type transistor and a P type transistor.

7. The integrated circuit according to claim 1, wherein an alloy zone envelopes an upper portion and a lateral portion of the source or drain contact pad traversing the second semiconducting layer, the alloy zone being in contact with a portion of the second semiconducting layer.

8. A method for producing the integrated circuit according to claim 1, the method comprising:
   providing a structure comprising at least one transistor of a lower level, the at least one transistor having a channel region formed in a first semiconducting layer, and forming transistor gate patterns of an upper level on the structure, and then
   assembling the structure, with a support provided with at least one second semiconducting layer resting on a substrate, respective channel regions of transistors of the upper level being provided in the second semiconducting layer.

9. The method according to claim 8, further comprising, after assembly of the structure with the support, performing a localised thinning of a given zone of the second semiconducting layer to form a thinned given zone with respect to regions of greater thickness on either side of the given zone of the second semiconducting layer.

10. The method according to claim 9, wherein the localised thinning includes oxidation of an upper portion of the given zone at a temperature below 500° C.

11. The method according to claim 9,
    wherein the localised thinning includes oxidation of an upper portion of the given zone through an opening of a mask formed on the second semiconducting layer,
    the method further comprising:
       removing the mask, whereas an oxide masking resulting from the oxidation of the upper portion of said given zone is conserved, and
       doping or siliciding of semiconducting regions on either side of the given zone, the given zone being protected by the mask.

12. The integrated circuit according to claim 1, wherein the first transistor belongs to a logic cell or to a memory cell or to a circuit block, the logic cell or the memory cell or the circuit block having at least one input and at least one output connected to one or more connection zones disposed between the first semiconducting layer and the second semiconducting layer.

\* \* \* \* \*